United States Patent
Lee et al.

(10) Patent No.: US 7,161,357 B2
(45) Date of Patent: Jan. 9, 2007

(54) APPARATUS FOR MEASURING READ RANGE BETWEEN RFID TAG AND READER

(75) Inventors: Jong Moon Lee, Choongcheongbuk-do (KR); Nae Soo Kim, Daejeon (KR); Cheol Sig Pyo, Daejeon (KR); Jong Suk Chae, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/296,056

(22) Filed: Dec. 7, 2005

(65) Prior Publication Data

US 2006/0261821 A1    Nov. 23, 2006

(30) Foreign Application Priority Data

May 17, 2005 (KR) ............ 10-2005-0041031
Jul. 26, 2005 (KR) ............ 10-2005-0067821

(51) Int. Cl.
*G01R 29/00* (2006.01)
(52) U.S. Cl. .................... 324/600; 324/627
(58) Field of Classification Search ............ 324/627
See application file for complete search history.

(56) References Cited

U.S. PATENT DOCUMENTS

| | | | |
|---|---|---|---|
| 4,800,387 A | 1/1989 | Joy et al. | |
| 4,968,983 A | 11/1990 | Maeda et al. | |
| 5,532,704 A * | 7/1996 | Ruelle | 343/703 |
| 5,805,667 A * | 9/1998 | Alvarez et al. | 379/1.01 |
| 6,104,291 A | 8/2000 | Beauvillier et al. | |
| 2001/0052779 A1* | 12/2001 | Okazaki | 324/637 |
| 2005/0059355 A1* | 3/2005 | Liu | 455/67.14 |
| 2005/0092838 A1 | 5/2005 | Tsirline et al. | |

FOREIGN PATENT DOCUMENTS

| | | |
|---|---|---|
| WO | 03/056349 | 7/2003 |
| WO | 2005/015480 | 2/2005 |

* cited by examiner

*Primary Examiner*—Vincent Q. Nguyen
(74) *Attorney, Agent, or Firm*—Ladas & Parry LLP

(57) ABSTRACT

Provided is an apparatus for measuring a read range between a tag and a reader, which includes an electromagnetic anechoic chamber formed by connecting at least one unit cell in a row, the unit cell having an electromagnetic wave absorbent provided on an inner wall of each unit cell, an electromagnetic generation portion located at the unit cell at an end of the electromagnetic anechoic chamber and transmitting an electromagnetic wave through an antenna, and an electromagnetic measurement portion which measures a field strength of the electromagnetic wave transmitted from the electromagnetic generation portion using an electric field probe moving in the electromagnetic anechoic chamber.

20 Claims, 3 Drawing Sheets

APPARATUS FOR MEASURING READ RANGE BETWEEN RFID TAG AND READER

CROSS-REFERENCE TO RELATED PATENT APPLICATIONS

This application claims the benefits of Korean Patent Application No. 10-2005-0041031, filed on May 17, 2005, and Korean Patent Application No. 10-2005-0067821, filed on Jul. 26, 2005, in the Korean Intellectual Property Office, the disclosure of which are incorporated herein in their entirety by reference.

BACKGROUND OF THE INVENTION

1. Field of the Invention

The present invention relates to an apparatus for measuring a read range between an RFID (radio frequency identification) tag and a reader, and more particularly, to an apparatus for measuring an accurate field strength according to the distance between an RFID tag and a reader using an electromagnetic anechoic chamber having easy mobility and extendability.

2. Description of the Related Art

A conventional method for measuring a read range between an RFID tag and a reader includes a method for manually measuring a distance between an RFID tag and a reader and roughly extracting the distance by determining the read range and a method for measuring a read range using an electromagnetic anechoic chamber.

The former method cannot measure an accurate read range while the latter method is difficult to measure an accurate read range because the absorption rate of an electromagnetic absorbent varies according to the position of measurement in an antenna chamber. Also, in the latter method, moving a system after the system is installed is not possible and extension of the antenna chamber is difficult.

SUMMARY OF THE INVENTION

To solve the above and/or other problems, the present invention provides an apparatus for measuring a read range between an RFID tag and a reader which provides an electromagnetic anechoic chamber having easy mobility and extendability and accurately determines whether the RFID tag is read according to the position and analyses the pattern of an antenna by accurately measuring a field strength according to the distance and angle between the RFID tag and the reader.

According to an aspect of the present invention, an apparatus for measuring a read range between a tag and a reader comprise an electromagnetic anechoic chamber formed by connecting at least one unit cell in a row, the unit cell having an electromagnetic wave absorbent provided on an inner wall of each unit cell, an electromagnetic generation portion located at the unit cell at an end of the electromagnetic anechoic chamber and transmitting an electromagnetic wave through an antenna, and an electromagnetic measurement portion which measures a field strength of the electromagnetic wave transmitted from the electromagnetic generation portion using an electric field probe moving in the electromagnetic anechoic chamber.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

An anechoic chamber in which an electromagnetic wave is not echoed is necessary for accurately measuring a read range between a tag and a reader. The present invention does not provide an electromagnetic anechoic chamber having a fixed size, but provide an electromagnetic anechoic chamber formed by assembling a plurality of unit cells for the facilitation of mobility and extendability.

Figure 1:
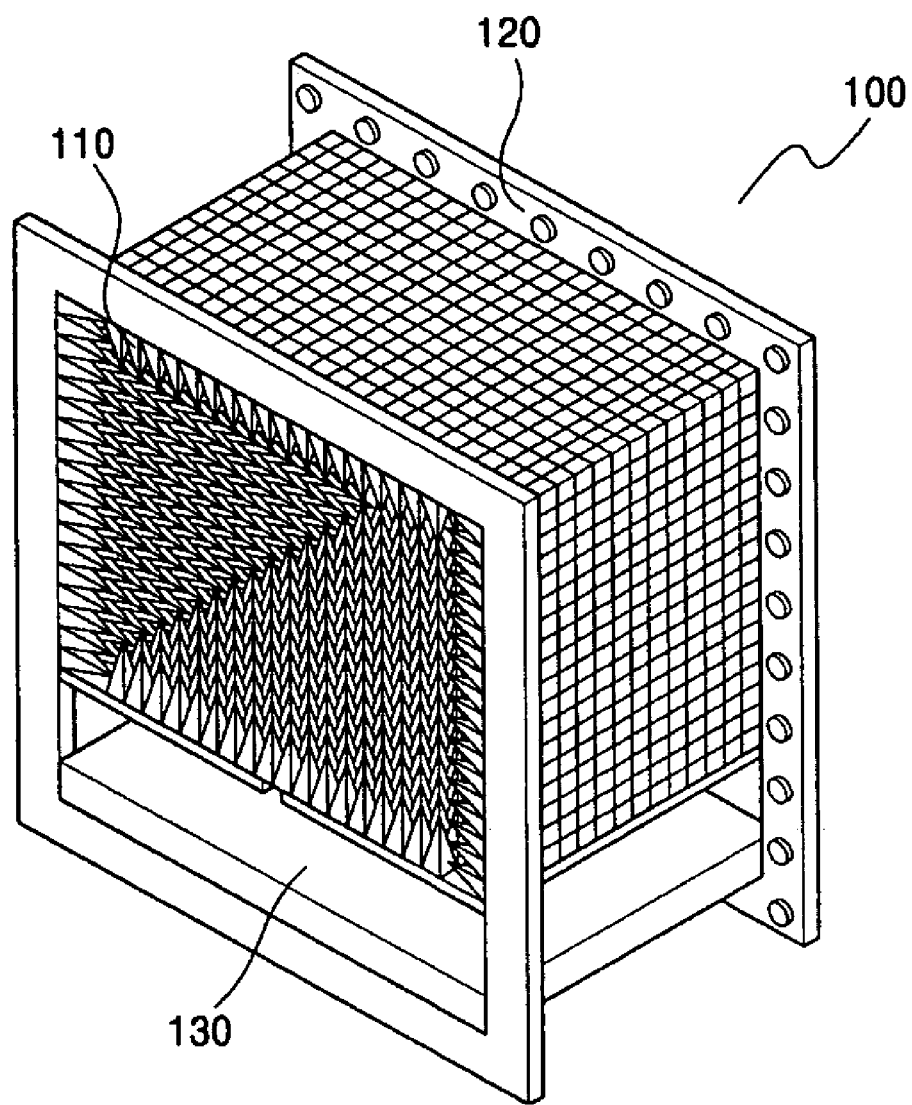
FIG. 1 is a perspective view of a unit cell of an electromagnetic anechoic chamber according to an embodiment of the present invention.

FIG. 1 shows a unit cell 100 of an electromagnetic anechoic chamber according to an embodiment of the present invention. Referring to FIG. 1, the unit cell 100 includes an electromagnetic absorbent 110 that is based on carbon, a cell connection frame 120, and a tag support portion moving path 130. The electromagnetic absorbent 110 is located on an inner wall of the unit cell 100 to absorb an electromagnetic wave. The cell connection frame 120 is a connection member to connect cells so that a user can connect a desired number of the unit cells 100 in a series. The tag support portion moving path 130 is a path along which a support portion (refer to FIGS. 2A and 2B) where an electric field probe for measuring a field strength moves between the unit cells 100.

To obtain a reliable value in the measurement of a read range between a tag and a reader, the effect of shielding an electromagnetic wave of the electromagnetic anechoic chamber is designed to be less than −100 dB in all desired frequency bands and the rate of absorption of an electromagnetic wave is not more than −25 dB at all positions in the electromagnetic anechoic chamber.

Figure 2A:
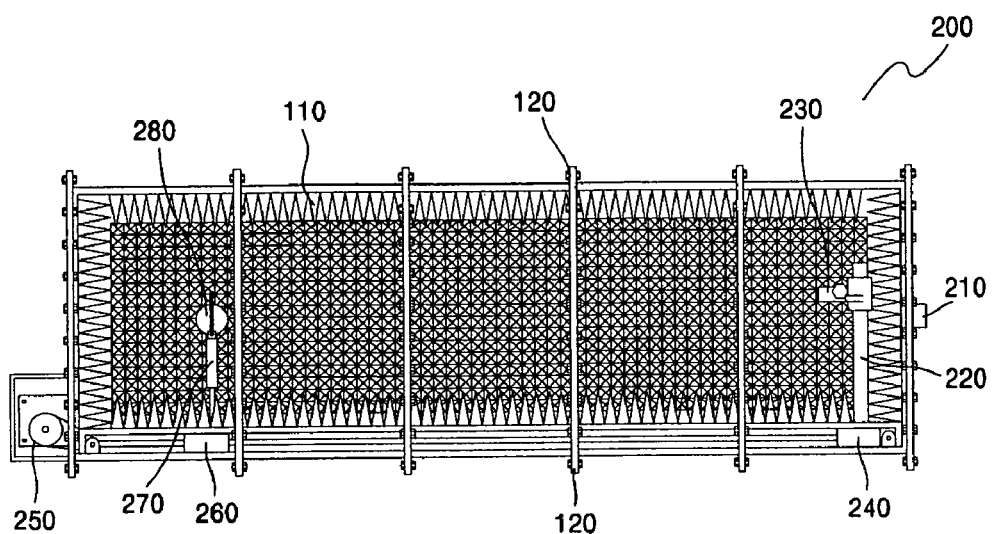
FIGS. 2A and 2B show the structure of an apparatus for measuring a read range between an RFID tag and a reader according to an embodiment of the present invention.
Figure 2B:
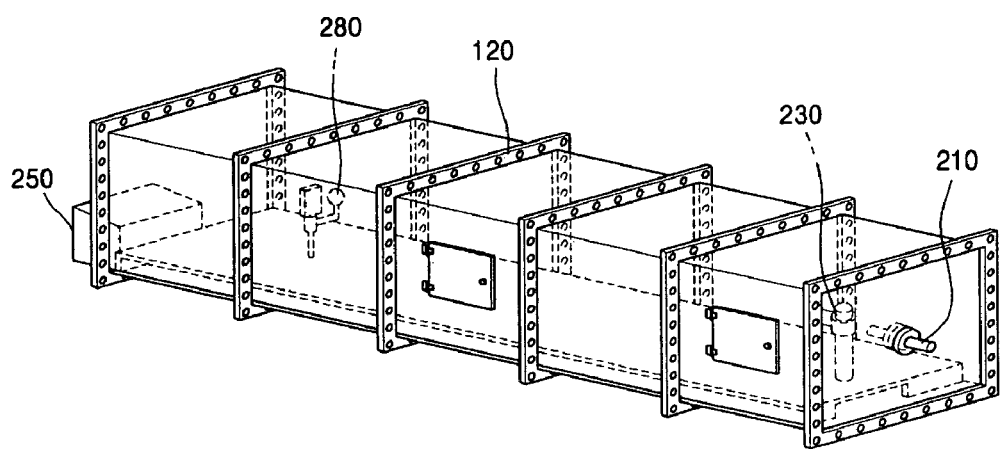

FIGS. 2A and 2B show the structure of an apparatus for measuring a read range between an RFID tag and a reader according to an embodiment of the present invention. Referring to FIGS. 2A and 2B, an apparatus for measuring a read range between an RFID tag and a reader according an embodiment of the present invention includes an electromagnetic anechoic chamber including a plurality of cells connected one another, an electromagnetic generation portion emitting an electromagnetic wave, and an electromagnetic measurement portion measuring the field strength of the emitted electromagnetic wave.

In detail, the electromagnetic anechoic chamber is formed by connecting a plurality of the cells shown in FIG. 1. In particular, both end cells of the electromagnetic anechoic chamber are cells where the electromagnetic generation portion and the electromagnetic measurement portion are located.

The electromagnetic generation portion is located at one end cell of the electromagnetic anechoic chamber and includes an external connector 210, an antenna support portion 220, a reader antenna 230, and a stepping motor 240. The external connector 210 connects an RF reader (not shown) and the reader antenna 230 of the electromagnetic generation portion. Thus, an electromagnetic wave generated by the external RF reader is transmitted to the read antenna 230 in the electromagnetic anechoic chamber via the external connector 210. The reader antenna 230 emits the received electromagnetic wave into the electromagnetic anechoic chamber.

The antenna support portion 220 has a rod shape and is installed in the end cell of the electromagnetic anechoic chamber. The rod has an arm at one end thereof and the reader antenna 230 is fixed to the arm. A stepping motor 240 is installed under the antenna support portion 220 and controls the change in height, that is, moving up and down, of the antenna support portion 230 and the rotation of the arm. Thus, the reader antenna 230 fixed to the antenna support portion 220 can move up and down and rotate within a predetermined range according to the control of the stepping motor 240.

The electromagnetic measurement portion is located at a cell opposite to the cell where the electromagnetic generation portion is located. The electromagnetic measurement portion includes a first stepping motor 250, a second stepping motor 260, a tag support portion 270, and an electric field probe 280.

The electric field probe 280 measures the field strength of the electromagnetic wave emitted by the reader antenna 230 of the electromagnetic generation portion. The tag support portion 270 has a rod shape and an arm having a predetermined length. The electric field probe 280 is fixed to the arm of the tag support portion 270. The second stepping motor 260 is installed under the tag support portion 270 to control the up/down movement of the tag support portion 270 and the rotation of the arm of the tag support portion 270.

The first stepping motor 250 controls the tag support portion 270 to move between both end cells of the electromagnetic anechoic chamber. That is, the first stepping motor 250 controls the tag support portion 270 with the electric field probe to move back and forth from one end cell to the other end cell or the electromagnetic generation portion through the tag support portion moving path 130 of FIG. 1 in the cell 100. Thus, the electric field probe 280 fixed to the tag support portion 270 can be moved up and down, and left and right, and rotated by the first and second stepping motors 250 and 260 in the electromagnetic anechoic chamber.

Figure 3:
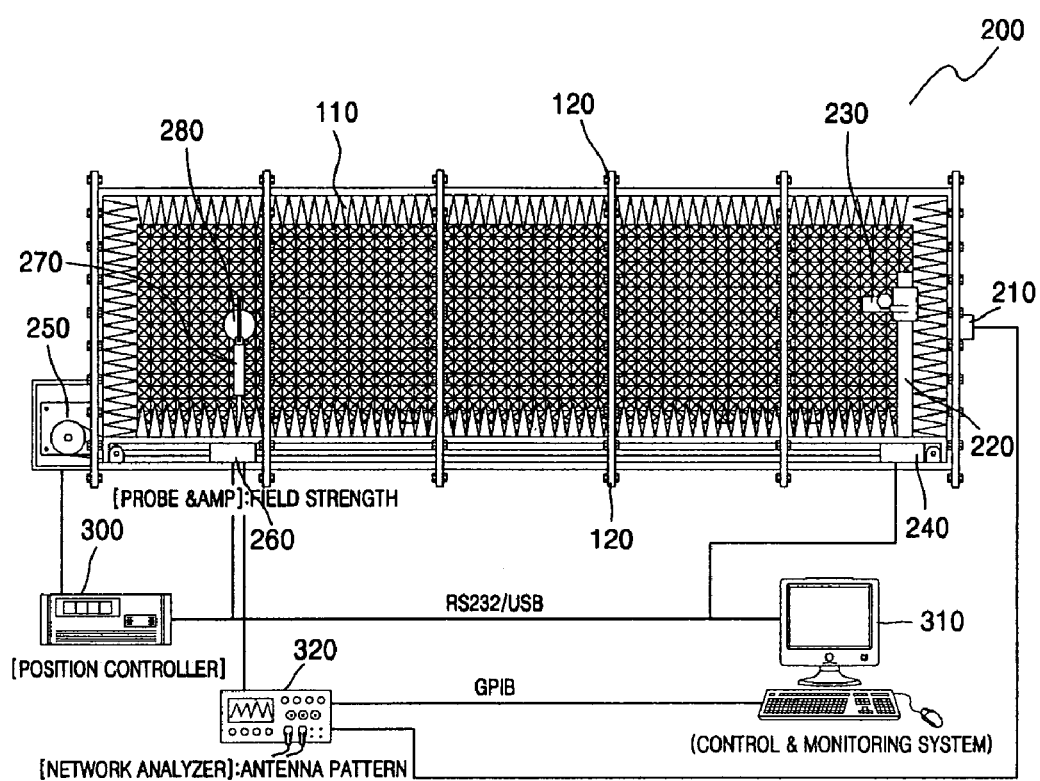
FIG. 3 is a view showing an example of an apparatus for measuring a read range between an RFID tag and a reader according to an embodiment of the present invention.

FIG. 3 is a view showing an example of an apparatus for measuring a read range between an RFID tag and a reader according to an embodiment of the present invention. Referring to FIG. 3, the apparatus for measuring a read range includes control portions 300, 310, and 320 for controlling the stepping motors in the read range measurement apparatus 200 shown in FIG. 2 and analyzing the field strength.

An external RFID is connected to the external connector 210 located at one end cell of the electromagnetic anechoic chamber. The electric field probe 280 is located aligned with the center of the reader antenna 230. The distance between the reader antenna 230 and the electric field probe 280 is maintained about 5 cm.

The stepping motor 240 of the electromagnetic generation portion and the stepping motors 250 and 260 of the electromagnetic measurement portion are connected to a position controller 300. The position controller 300 is connected to a central controller 310. When a user inputs positional information of the stepping motors through the central controller 310, the position controller 300 controls the stepping motors 240, 250, and 260 of the electromagnetic generation portion and the electromagnetic measurement portion according to the input positional information. The central controller 310 measures the field strength of an electromagnetic wave according to the position controlled by the position controller 300 through the electric field probe 280. The position controller 300 controls all the stepping motors 240, 250, and 260. Alternatively, the position controller 300 controls the first stepping motor 250 of the electromagnetic generation portion while the central controller 310 directly controls the other stepping motors 240 and 260.

The central controller 310 collects field strength data according to the position of the electric field probe 280. When the central controller 310 completes the collection of the field strength data according to the position, the user removes the electric field probe 280 and installs a tag or an object to which a tag is attached in the electromagnetic anechoic chamber. The readability between the tag and the reader antenna is measured through the electric field probe in the same manner used to measure the field strength.

The pattern analyzer 320 measures the transmission pattern of the tag and the reader to increase the usability of the electromagnetic anechoic chamber. The tag and the reader are positioned on the tag support portion 270 and the a standard antenna suitable for a frequency is positioned on the antenna support portion 220. Thus, after the present system is set identical to a general near field antenna measurement system, the transmission pattern of the tag and the reader is measured.

Accordingly, the recognition between the tag and the reader according to the angle and the height can be seen. When the tag is not recognized at an arbitrary point, the data about the distance, angle, and height between the tag and the reader, and the field strength can be analyzed. These analyzed data can be used as reference data indicating the performance between the tag and the reader.

While this invention has been particularly shown and described with reference to preferred embodiments thereof, it will be understood by those skilled in the art that various changes in form and details may be made therein without departing from the spirit and scope of the invention as defined by the appended claims.

As described above, in the apparatus for measuring a read range between a RFID tag and a reader according to the present invention, the field strength according to the position is accurately measured by the automatic control and a graph for analysis of measured data is simultaneously provided so that the measuring time is reduced and reliability is improved. The recognition of a tag at an arbitrary position such at the distance, angle, and height between the tag and the reader is more accurately determined. When an RFID system is developed, the reliable performance of the tag and the reader can be determined by accurately measuring the field strength at the position. Also, the electromagnetic anechoic chamber according to the present invention has an advantage of performing a role of the conventional large antenna chamber by measuring the transmission pattern of the tag and the reader antenna in addition to the measurement of an accurate read range between the tag and the reader.

What is claimed is:

1. An apparatus for measuring a read range between a tag and a reader, the apparatus comprising:
 an electromagnetic anechoic chamber comprising:
  two end unit cells, each end unit cell having an inner wall with an opening;

wherein an electromagnetic wave absorbent is provided on the inner wall, and wherein the opening of each end cell is capable of being joined to an opening of the other end unit cell;

an electromagnetic generation portion located at one end unit cell of the electromagnetic anechoic chamber and transmitting an electromagnetic wave through an antenna; and an electromagnetic measurement portion which measures a field strength of the electromagnetic wave transmitted from the electromagnetic generation portion using an electric field probe moving in the electromagnetic anechoic chamber.

2. The apparatus as claimed in claim 1, wherein the end unit cells are joined at their openings to form the electromagnetic anechoic chamber.

3. The apparatus as claimed in claim 2, wherein the end unit cell has a carbon-based electromagnetic wave absorbent which is provided on the inner wall.

4. The apparatus as claimed in claim 2, wherein the electromagnetic generation portion moves the antenna up and down and rotate the antenna at a predetermined angle.

5. The apparatus as claimed in claim 2, wherein the electromagnetic generation portion comprises:

the antenna emitting an electromagnetic wave;

an external connector connecting the antenna and an external RFID reader; and an antenna support portion having an arm located at a rod having a predetermined length, fixing the antenna at an end of the arm, and performing an up/down motion of the rod and a rotational motion of the arm.

6. The apparatus as claimed in claim 2 wherein the electromagnetic measurement portion allows the electric field probe to linearly move along the end unit cells, move up/down, and rotate at a predetermined angle in the electromagnetic anechoic chamber.

7. The apparatus as claimed in claim 2, wherein the electromagnetic measurement portion comprises:

an electric field probe measuring a field strength of an electromagnetic wave transmitted from the electromagnetic generation portion;

a tag support portion having a rod having a predetermined length and arm located at an end of the rod, the electric field probe being fixed to an end of the arm, and performing an up/down motion of the rod and a rotational motion of the arm; and a stepping motor moving the tag support portion between the unit cells at both ends of the electromagnetic anechoic chamber.

8. The apparatus as claimed in claim 2, further comprising a positional control portion controlling up/down and rotational motions of the antenna of the electromagnetic generation portion and a movement of the electric field probe of the electromagnetic measurement portion.

9. The apparatus as claimed in claim 2, further comprising a central control portion checking a field strength according to a relative position between the antenna and the electric field probe.

10. The apparatus as claimed in claim 2, further comprising a pattern analysis portion measuring a transmission pattern of the tag and the reader in a near field antenna measurement method when the tag and the reader are located at the electromagnetic measurement portion and a standard antenna suitable for the tag and the reader is located at the electromagnetic generation portion.

11. The apparatus as claimed in claim 1 further comprising:

one or more mid unit cells, each having two openings, wherein each opening of the mid unit cell is capable of being joined to the opening of the end unit cell or the opening of another mid unit cell.

12. The apparatus as claimed in claim 11, wherein the electromagnetic anechoic chamber is formed by joining the openings of the two end unit cells and one or more mid unit cells therebetween the two end unit cells.

13. The apparatus as claimed in claim 12, wherein each of the end unit cells and the mid unit cells has a carbon-based electromagnetic wave absorbent which is provided on the inner wall.

14. The apparatus as claimed in claim 12, wherein the electromagnetic generation portion moves the antenna up and down and rotate the antenna at a predetermined angle.

15. The apparatus as claimed in claim 12, wherein the electromagnetic generation portion comprises:

the antenna emitting an electromagnetic wave;

an external connector connecting the antenna and an external RFID reader; and an antenna support portion having an arm located at a rod having a predetermined length, fixing the antenna at an end of the arm, and performing an up/down motion of the rod and a rotational motion of the arm.

16. The apparatus as claimed in claim 12 wherein the electromagnetic measurement portion allows the electric field probe to linearly move along the end unit cells and the mid units cells joined to each other, move up/down, and rotate at a predetermined angle in the electromagnetic anechoic chamber.

17. The apparatus as claimed in claim 12, wherein the electromagnetic measurement portion comprises:

an electric field probe measuring a field strength of an electromagnetic wave transmitted from the electromagnetic generation portion;

a tag support portion having a rod having a predetermined length and arm located at an end of the rod, the electric field probe being fixed to an end of the arm, and performing an up/down motion of the rod and a rotational motion of the arm; and a stepping motor moving the tag support portion between the unit cells at both ends of the electromagnetic anechoic chamber.

18. The apparatus as claimed in claim 12, further comprising a positional control portion controlling up/down and rotational motions of the antenna of the electromagnetic generation portion and a movement of the electric field probe of the electromagnetic measurement portion.

19. The apparatus as claimed in claim 12, further comprising a central control portion checking a field strength according to a relative position between the antenna and the electric field probe.

20. The apparatus as claimed in claim 12, further comprising a pattern analysis portion measuring a transmission pattern of the tag and the reader in a near field antenna measurement method when the tag and the reader are located at the electromagnetic measurement portion and a standard antenna suitable for the tag and the reader is located at the electromagnetic generation portion.

* * * * *